United States Patent [19]

Deines et al.

[11] 4,028,149
[45] June 7, 1977

[54] PROCESS FOR FORMING MONOCRYSTALLINE SILICON CARBIDE ON SILICON SUBSTRATES

[75] Inventors: John L. Deines, Pleasant Valley; San-Mei Ku, Poughkeepsie; Michael R. Poponiak, Newburgh; Paul J. Tsang, Poughkeepsie, all of N.Y.

[73] Assignee: IBM Corporation, Armonk, N.Y.

[22] Filed: June 30, 1976

[21] Appl. No.: 701,452

[52] U.S. Cl. .................. 148/175; 29/577; 29/578; 29/580; 148/174; 156/612; 156/648; 156/654; 204/15; 204/32 S; 204/129.3; 204/129.65; 357/40; 357/49; 357/50; 357/55; 357/58; 357/59; 357/61; 423/345; 427/87; 427/93; 427/249

[51] Int. Cl.² .............. H01L 21/76; H01L 21/20; H01L 27/04

[58] Field of Search .......... 148/174, 175; 156/217, 156/612; 423/345; 204/129.3, 129.65, 15, 325; 29/577, 578, 580; 357/40, 49, 50, 59; 427/87, 93, 249

[56] References Cited

UNITED STATES PATENTS

| | | | |
|---|---|---|---|
| 3,386,866 | 6/1968 | Ebert et al. | 148/175 |
| 3,389,022 | 6/1968 | Kravitz | 148/174 |
| 3,397,448 | 8/1968 | Tucker | 29/577 |
| 3,400,309 | 9/1968 | Doo | 357/49 X |
| 3,640,806 | 2/1972 | Watanabe et al. | 204/32 S X |
| 3,690,969 | 9/1972 | Hays et al. | 148/188 |
| 3,919,060 | 11/1975 | Pogge et al. | 204/129.3 |
| 3,929,529 | 12/1975 | Poponiak | 148/175 X |
| 3,954,523 | 5/1976 | Magdo et al. | 148/175 |

FOREIGN PATENTS OR APPLICATIONS 1,162,565  8/1969  United Kingdom .............. 357/49

OTHER PUBLICATIONS

Schlack, M. "Method of Epitaxially Growing Silicon Carbide", I.B.M. Tech. Discl. Bull., vol. 8, No. 4, Sept. 1965, p. 667.

Primary Examiner—L. Dewayne Rutledge
Assistant Examiner—W. G. Saba
Attorney, Agent, or Firm—Wolmar J. Stoffel

[57] ABSTRACT

A method for forming monocrystalline silicon carbide on a silicon substrate by converting a portion of the monocrystalline silicon substrate into a porous silicon substance by anodic treatment carried out in an aqueous solution of hydrofluoric acid, heating the resultant substrate to a temperature in the range of 1050° C to 1250° C in an atmosphere that includes a hydrocarbon gas for a time sufficient to react the porous silicon and the gas, thereby forming a layer of monocrystalline silicon carbide on the silicon substrate.

12 Claims, 15 Drawing Figures

PROCESS FOR FORMING MONOCRYSTALLINE SILICON CARBIDE ON SILICON SUBSTRATES

DESCRIPTION OF THE PRIOR ART

This invention relates to the manufacture of monocrystalline silicon carbide and, more particularly, to a method of forming monocrystalline silicon carbide on silicon substrates.

Silicon carbide has been known for some time and has been employed in applications that utilize its hardness and inertness properties. For example, a protective inert coating of silicon carbide on a carbon crucible is described in U.S. Pat. No. 3,385,723. It has also been proposed for use as passivating and insulating layers in semiconductor devices in U.S. Pat. Nos. 3,397,448, 3,400,309 and 3,451,867. In addition, the semiconducting characteristics of monocrystalline silicon carbide have been recognized, as indicated by U.S. Pat. No. 3,063,876, 3,228,756, and 3,389,022. Monocrystalline silicon carbide is a high temperature material which has a large energy band gap. Consequently, it is an attractive semiconductor material for use in producing semiconductor devices that must operate at high temperatures. The wide band gap of this material alleviates the problem of conduction by thermally generated carriers generated at high temperatures. Semiconductor devices formed of silicon carbide can be operated at temperatures on the order of 500° to 600° C. These operating temperatures are impossible with devices made of more conventional monocrystalline silicon or germanium. Further, the use of monocrystalline silicon in light emitting diodes is advantageous because the emitted light is in the visible spectrum.

In semiconductor applications, particularly integrated circuit device applications, it is important that the techniques for forming monocrystalline silicon carbide be compatible with planar technology, i.e. forming silicon carbide on very small selected regions on a monocrystalline silicon substrate while preserving the general surface planarity. Presently, there are no satisfactory techniques for accomplishing this objective.

SUMMARY OF THE INVENTION

An object of this invention is to provide a new method for forming semiconducting silicon carbide.

Another object of this invention is to provide a new method for forming monocrystalline silicon carbide in selected regions on a monocrystalline silicon substrate.

Yet another object of this invention is to provide a new method of producing semiconducting devices formed of silicon carbide.

These and other objects of our invention are accomplished in the method for forming monocrystalline silicon carbide on a monocrystalline silicon substrate wherein a portion of the monocrystalline silicon substrate is converted to a porous silicon substance by an anodic treatment carried out in an aqueous solution of hydrofluoric acid, heating the resultant substrate to a temperature in the range of 1050° C to 1250° C in an atmosphere that includes a hydrocarbon gas selected from the group consisting of methane, ethane, ethylene, propane, propylene, and mixtures thereof for a time sufficient to react the porous silicon and the gas thereby forming a layer of monocrystalline silicon carbide and an overlying layer of polycrystalline silicon carbide.

BRIEF DESCRIPTION OF THE DRAWINGS

In the accompanying drawings

DESCRIPTION OF THE PREFERRED EMBODIMENTS

Figure 1:
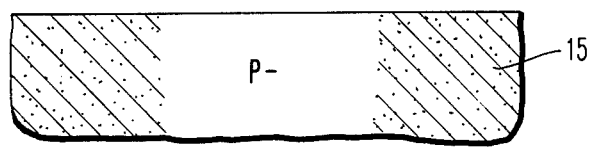
FIGS. 1-3 is a sequence of elevational views in broken section which illustrate a preferred embodiment of the method of the invention of forming a layer of monocrystalline silicon carbide on a silicon substrate.
Figure 2:
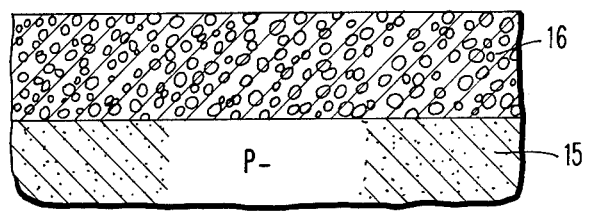
Figure 3:
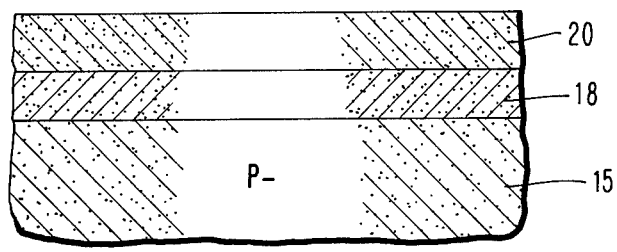

Referring now to the drawings, in particular FIGS. 1-3, there is depicted a preferred specific embodiment for forming a blanket layer of monocrystalline silicon carbide on a silicon wafer. FIG. 1 illustrates the nature of the starting substrate 15. Substrate 15 is of monocrystalline silicon having a P-type impurity with a concentration in the range of $5 \times 10^{14}$ to $10^{20}$ which provides a resistivity in the range of 20 to 0.001$\Omega$ cm. One surface of substrate 15 is anodized forming a blanket layer 16 of porous silicon. This can be conveniently achieved by anodizing the substrate 15 in an aqueous HF solution at a current density sufficient to achieve porosity. In general, the anodizing solution should contain HF in an amount greater than ten percent and, more particularly, from 12 to 33 percent. The most desirable solution concentration for a specific application will depend on the device configuration, dopant concentration, solution temperature, current density, etc. The substrate 15 is made the anode in the HF solution through a contact normally on the back side. A suitable counterelectrode in the anodizing solution, as is conventional, acts as the cathode. After the anodization step is completed, the average porosity of the porous layer 16 should be greater than forty percent, more preferably from 40 to 60 percent, and most preferably on the order of 56 percent. The anodization of a silicon wafer for forming porous silicon is disclosed in U.S. Pat. No. 3,646,806 and in greater detail. After the anodization is completed, the substrate 15 with the porous silicon layer 16 is heated to a temperature on the order of 1050° C to 1250° C in a suitable reaction vessel and a hydrocarbon gas flowed over the heated substrate. The heating can be accomplished conveniently by placing the substrate 15 on a graphite susceptor, heated by induction which is contained in a reaction vessel with inlets and outlets suitable for flowing gas over the substrate. Any suitable carbon bearing gas which will react with the porous silicon can be flowed through the reactor. Typical hydrocarbon gases are methane, ethane, ethylene, propane and propylene. Preferably, the gases are combined with a carrier gas such as argon, helium, nitrogen, or the like. The heating of the substrate in the hydrocarbon gases at the temperatures mentioned is continued for a time sufficient to form a monocrystalline silicon carbide layer 18 on the silicon substrate 15 and an overlying polycrystalline silicon carbide layer 20 overlying the monocrystalline silicon carbide layer. The heating time is typically on the order of one-half hour. The substrate 15 as shown in FIG. 3 can be further processed typically by removing the polycrystalline silicon carbide layer 20 by a suitable chemical, abrading, or sputter etching process and subsequently processed into a suitable type of device or light emitting diode structure. The substrate can be divided into discrete devices after it has been processed. Impurities can be introduced into the monocrystalline silicon carbide layer 18 in a number of ways. An impurity can be combined into the hydrocarbon gas stream in the reactor during the conversion of porous silicon to monocrystalline silicon carbide, or impurities can be introduced by conventional ion implantation techniques. The techniques for ion implantation which include masking and the like are known in the art and are not part of this invention.

Figure 4:
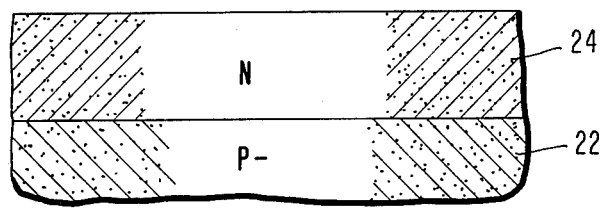
FIGS. 4-10 is another sequence of elevational views in broken section of substrates at various stages which illustrate another preferred specific embodiment of our invention.
Figure 5:
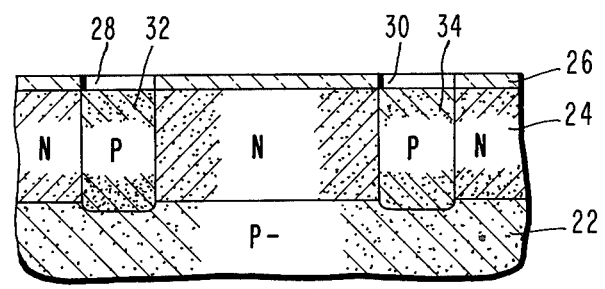
Figure 6:
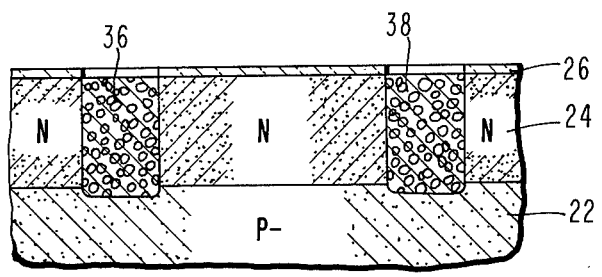
Figure 7:
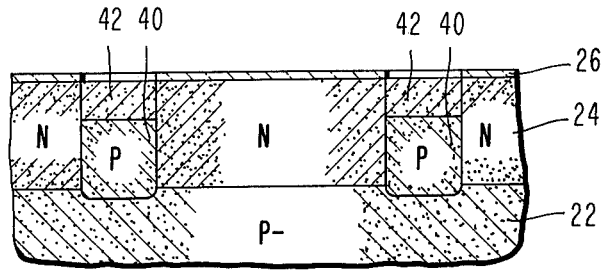
Figure 8:
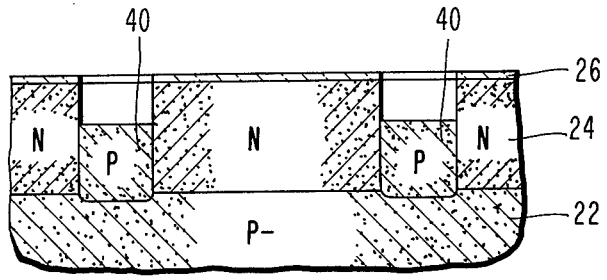
Figure 9:
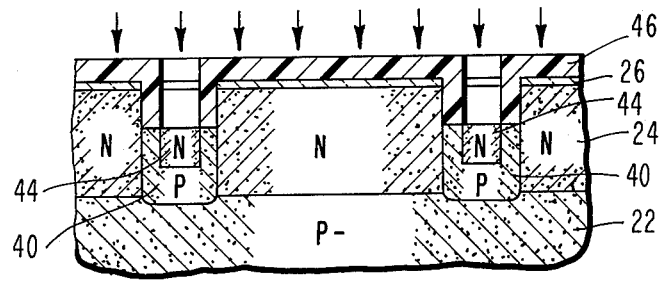
Figure 10:
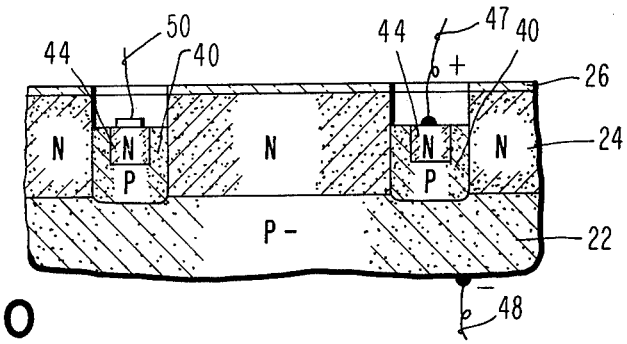

In FIGS. 4–10 there is depicted another preferred specific embodiment of the process of our invention wherein only selected portions of monocrystalline silicon carbide are formed on a monocrystalline silicon wafer. As indicated in FIG. 4, the starting substrate 22 is a monocrystalline silicon wafer having a P-type background doping, preferably with a resistivity on the order of 10–20Ω cm. An epitaxial layer 24 containing an N-type conductivity impurity and having a thickness in the range of one to six microns is deposited on substrate 22 using conventional epitaxial techniques. Depending on the use of the device and what is to be combined on the substrate with the monocrystalline silicon carbide regions, additional steps may be required for forming buried high conductivity regions in the substrate which will form a part of conventional integrated circuit semiconductor devices. As shown in FIG. 5, a masking layer 26, typically a layer of thermally grown $SiO_2$, is formed on the surface of layer 24 and openings 28 and 30 formed therein using conventional masking, photolithographic and etching techniques. P-type regions 32 and 34 are formed by diffusion or ion implantation. As indicated in FIG. 6, the monocrystalline silicon in regions 32 and 34 is converted to porous silicon structure by anodizing the substrate in an HF solution as described previously. Contact to the substrate can be made through the back of silicon substrate 22. The porosity of the resultant regions 36 and 38 of porous silicon can be controlled by the current density used during the anodization step, the strength of the HF anodizing solution, and the concentration of the P-type impurity in regions 32 and 34. Preferably, the porosity is between forty and sixty percent, more preferably 56 percent. During the anodization step, the thickness of $SiO_2$ layer 26 is decreased. Subsequently, the substrate 22 containing the porous silicon regions 36 and 38 is heated in a hydrocarbon gas for a time and a temperature sufficient to form a layer 40 of monocrystalline silicon carbide on the silicon substrate and an overlying polycrystalline silicon carbide layer 42. Layer 26 prevents diffusion into the layer 24 when an impurity is combined with the hydrocarbon gas. The conditions required for forming the reaction between the porous silicon and the carbon in the hydrocarbon gas were discussed previously. A P-type impurity can be introduced along with the gas to impart a desired conductivity type to the region 40. As indicated in FIG. 8, the polycrystalline silicon carbide layer 42 is removed. This can be accomplished by sputter etching techniques. As indicated in FIG. 9, N-type impurities are introduced into the monocrystalline silicon carbide layer 40 forming a pocket of overlying N-type region 44. This can be conveniently accomplished by forming a masking layer, typically a resist layer 46, on the surface of oxide layer 26 removing the portions over regions 40 and implanting suitable N-type impurities utilizing conventional implantation techniques. This produces a PN junction in region 40 which can be utilized as a light emitting diode or a semiconductor device. Suitable contacts can be made to the region as shown in FIG. 10. A terminal 47 can be formed on a portion of the N region 44 and the opposite terminal 48 formed on the back side of substrate 22. Alternately, a conductive electrode 50 that is transparent can be deposited over region 44 and connected to a suitable driving means. Integrated circuit semiconductor devices can be formed in layer 24 by conventional techniques and used in conjunction with the light emitting diodes produced by the method of this invention.

Figure 11:
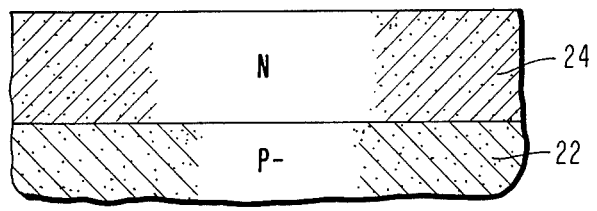
FIGS. 11-15 is yet another sequence of elevational views in broken section of a substrate illustrating another preferred embodiment of the method of our invention.
Figure 12:
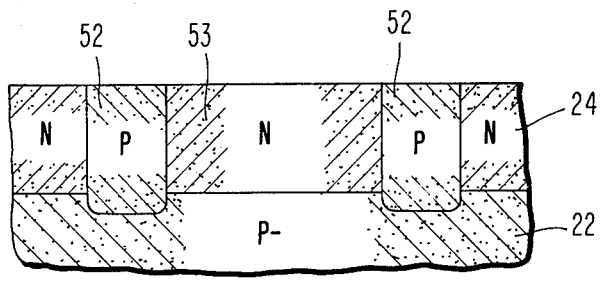
Figure 13:
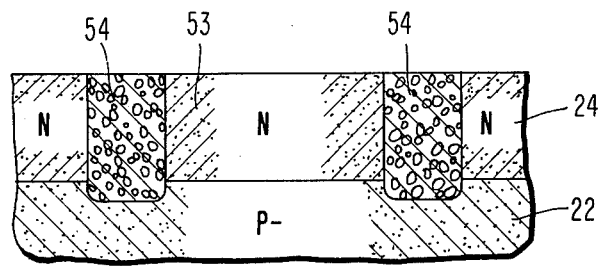
Figure 14:
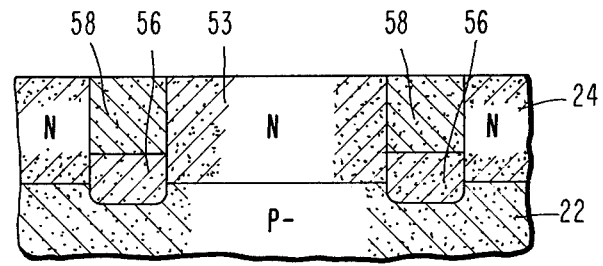
Figure 15:
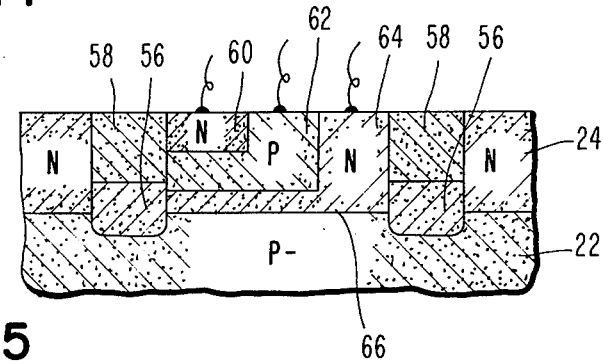

As shown in FIGS. 11–15, the method of our invention can be used to form regions for dielectrically isolating regions of semiconductor material on a common substrate. As indicated in FIG. 11, a monocrystalline silicon substrate 22 with an overlying epitaxial layer 24 is the starting element. If desired, suitable low resistivity regions can be made into substrate 22 prior to deposition of the epitaxial layer 24 to serve as subcollector regions, underpasses, and the like. As shown in FIG. 12, P-type regions 52 are formed by conventional masking and diffusion techniques. Regions 52 are generally annular in shape and surround the region 54 of epitaxial layer 24. The regions 52 are converted to porous silicon regions 54 as described previously with respect to FIGS. 3 and 6. The porous silicon regions 54 are converted to monocrystalline silicon carbide and overlying polycrystalline silicon carbide layers 56 and 58, respectively, using the same techniques disclosed in FIGS. 3 and 7 of the drawings. The resistivity of the combination monocrystalline and polycrystalline silicon carbide is sufficiently high on the order of $10^6$ to $10^{10}\Omega$ cm. so that it can be used as the dielectric sidewall isolating regions for integrated semiconductor devices. The region 53 is then processed for forming suitable devices as for example an emitter region 60, a base region 62 and a collector region 64 for forming a transistor. The resultant transistor or other device is then electrically isolated from similar adjacent devices in epitaxial layer 24 and substrate 22 by the annular sidewall region 58 in combination with the PN junction 66 at the interface of the substrate 22 and layer 24.

The following Example represents a preferred embodiment of the method of our invention and should not be construed to unduly limit the scope of the claims thereof.

EXAMPLE

A monocrystalline silicon wafer with a surface on the <100> crystalline orientation, and a background doping of boron at a concentration of $2.5 \times 10^{15}$ atoms/cc was selected. The entire surface of the wafer was anodized by placing the surface in contact with an aqueous HF solution with a concentration of 33 percent. Contact was made to the back side of the wafer and connected to the positive terminal of a current source. A platinum electrode was inserted in the solution and connected to the negative terminal of the current source. By regulating the voltage, a constant current density was maintained at 10 milliamps/cm². The current was maintained for a period of ten minutes. The wafer was then examined and the porosity and thickness of the resultant porous silicon layer measured. The porosity was approximately 56 percent and the thickness of the layer was 10 microns. The resultant wafer was placed on a graphite susceptor and placed in a reaction tube. The temperature of the susceptor was maintained at approximately 1125° C and a gas stream introduced. The gas stream consisted of 8 liters of nitrogen per minute combined with 200cc per minute of propane. At the end of thirty minutes, the gas stream was terminated and the power to the susceptor turned off. The wafer was examined and subsequently analyzed to determine the nature of the deposit thereon. The outer grey layer, consisting predominantly of polycrystalline silicon carbide, was removed by sputter etching. The underlying film which was continuous and very brittle was analyzed to determine its composition. Infrared transmission analysis technique revealed a silicon carbon peak at 12.6 microns. The ion probe analysis confirmed the presence of carbon in the material. Further analysis by transmission electron microscopy produced a diffraction pattern which clearly indicated that the bluish underlying layer consisted of a continuous layer of monocrystalline $\beta$ silicon carbide.

While this invention has been particularly shown and described with reference to the preferred embodiments thereof, it will be understood by those skilled in the art that the foregoing and other changes in form and detail may be made therein without departing from the spirit and scope of the invention.

What is claimed is:

1. A method for forming a monocrystalline silicon carbide on a monocrystalline silicon substrate comprising converting a portion of a monocrystalline silicon substrate into a porous silicon substance by an anodic treatment carried out in an aqueous solution of hydrofluoric acid, heating the resultant substrate to a temperature in the range of 1050° C to 1250° C in an atmosphere that includes a hydrocarbon gas selected from the group consisting of methane, ethane, ethylene, propane, propylene and mixtures thereof for a time sufficient to react the porous silicon and the gas thereby forming a lower layer of monocrystalline silicon carbide and an overlying layer of polycrystalline silicon carbide.

2. The method of claim 1 wherein the porous silicon substance has a porosity in the range of 40 to 60 percent.

3. The method of claim 2 wherein the resultant porous silicon substance is a surface layer of a thickness in the range of 0.1 to 10 microns.

4. The method of claim 2 wherein said silicon substrate is comprised of an N-type epitaxial silicon layer supported on a P-type silicon wafer.

5. The method of claim 4 wherein P-type regions are formed in the substrate which extend through the N-type epitaxial layer.

6. The method of claim 4 wherein P-type regions are formed in the substrate which extend partially through the N-type epitaxial layer.

7. The method of claim 5 wherein said P-type regions are annular in shape, and the resultant silicon carbide regions in combination with the PN junction formed at the interface of the epitaxial layer and wafer provide electrical isolation for the surrounded regions.

8. The method of claim 6 wherein the polycrystalline silicon carbide is removed leaving exposed the monocrystalline silicon carbide.

9. The method of claim 2 wherein a vaporized impurity for semiconductors is included in the atmosphere.

10. The method of claim 2 wherein said atmosphere includes a carrier gas.

11. The method of claim 1 wherein said overlying layer of polycrystalline silicon carbide is removed leaving the underlying monocrystalline silicon carbide exposed.

12. The method of claim 11 wherein the polycrystalline silicon carbide is removed by sputter etching techniques.

* * * * *